(12) United States Patent
Liu et al.

(10) Patent No.: US 9,111,811 B2
(45) Date of Patent: Aug. 18, 2015

(54) ANALOG MEMORY CELL CIRCUIT FOR THE LTPS TFT-LCD

(71) Applicant: National Chiao Tung University, Hsinchu (TW)

(72) Inventors: Po-Tsun Liu, Hsinchu (TW); Li-Wei Chu, Hsinchu (TW); Ming-Dou Ker, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/962,537

(22) Filed: Aug. 8, 2013

(65) Prior Publication Data

US 2013/0320348 A1 Dec. 5, 2013

Related U.S. Application Data

(62) Division of application No. 11/267,065, filed on Nov. 4, 2005, now Pat. No. 7,374,329.

(51) Int. Cl.
| | |
|---|---|
| G11C 27/00 | (2006.01) |
| H01L 27/12 | (2006.01) |
| H01L 33/08 | (2010.01) |
| G09G 3/36 | (2006.01) |

(52) U.S. Cl.
CPC .......... *H01L 27/1255* (2013.01); *G09G 3/3659* (2013.01); *H01L 33/08* (2013.01); *G09G 2300/0842* (2013.01)

(58) Field of Classification Search
USPC ....................... 365/45, 63, 108, 129, 174, 188
See application file for complete search history.

(56) References Cited

PUBLICATIONS

Chu et al., Design of Analog Pixel Memory Circuit with Low Temperature Polycrystalline Silicon TFTs for Low Power Application. SID Symposium Digest of Technical Papers, 41: 1363-1366, May 2010, John Wiley & Sons.*
Chu et al., design of Analog Pixel Memory for Low Power Application in TFT-LCDs, Journal of Diaplay Technology, vol. 7, No. 2, Feb. 2011.*

* cited by examiner

*Primary Examiner* — Fernando Hidalgo
(74) *Attorney, Agent, or Firm* — Bacon & Thomas, PLLC (57) ABSTRACT

The present invention provides an analog memory cell circuit for the LTPS TFT-LCD. The circuit comprises the first transistor, second transistor, the third transistor, the fourth transistor, the fifth transistor, the sixth transistor, the seventh transistor, and the capacitor. It comprises a plurality of operation period, wherein the transistors are controlled in accordance with the first scan signal, the second scan signal, and the third scan signal, the output signal is output in the opposite to the output jack.

1 Claim, 10 Drawing Sheets

(PRIOR ART)

Figure 1

(PRIOR ART)

ANALOG MEMORY CELL CIRCUIT FOR THE LTPS TFT-LCD

CROSS REFERENCE TO RELATED APPLICATIONS

This application is a divisional application of U.S. patent application Ser. No. 13/267,065, filed on Oct. 6, 2011, which claims priority to Taiwan application no. 100120492, filed on Jun. 13, 2011 (of which the entire disclosure of the pending, prior application is hereby incorporated by reference).

BACKGROUND OF THE INVENTION

1. Field of the Invention

The present invention relates to an analog memory cell circuit, particularly to an analog memory cell circuit for the low temperature polycrystalline silicon thin film transistor liquid crystal display (LTPS TFT-LCD).

2. Description of the Prior Art

Thin film transistor liquid crystal displays (TFT-LCDs) have become a mainstream of plannar display markets due to its light-weight, thin-thickness and high-contrast-ratio. However, power consumption becomes a serious issue for the TFT-LCDs, especially for the portable products. The research reports mentioned that the power consumption almost comes from the backlight system and AC power supplying to liquid crystal of the source drivers. Therefore, the memory-in-pixel (MIP) concept was proposed to meet low power application, which provided a low power standby mode for continuous display of static images without the power wastage on the source drivers. By refreshing the voltage level of scan lines, polarity inversion could be easily achieved even though the data is no longer furnished.

So far, the literatures were reported with the digital MIP circuits. They can be classified as two basic approaches; the static type and the dynamic type. In general, the static digital MIP circuit exhibits the lowest power consumption since the dynamic power is only consumed while pixels are charged during polarity inversion. However, the main drawback of the static digital MIP is too large in layout area for displaying with a fine pixel pitch. The static MIP circuits typically required seven or eight TFTs and six row lines per pixel. On the contrary, the dynamic digital MIP circuits are more attractive because of fewer TFTs and row lines per pixel.

Figure 1:
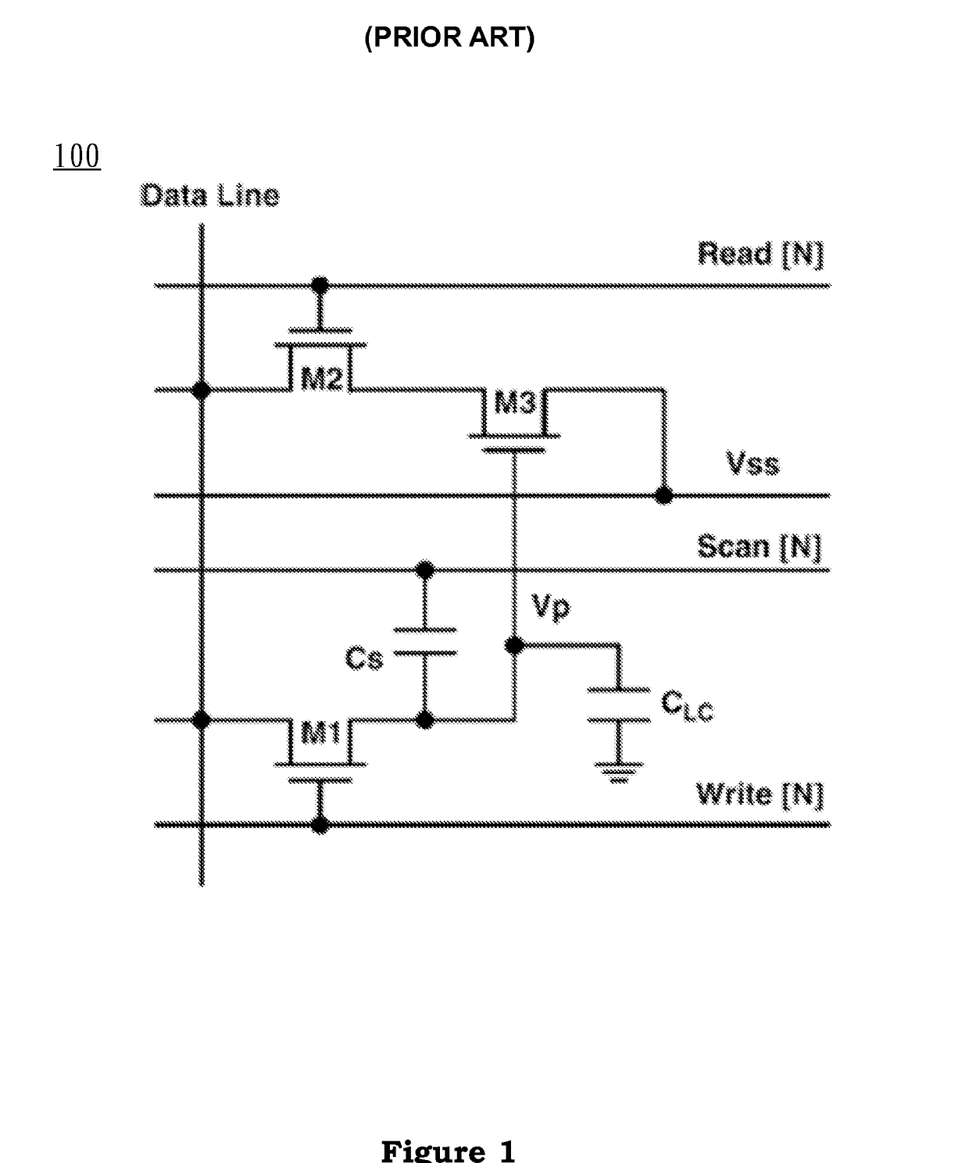
FIG. 1 is a schematic diagram showing the conventional dynamic digital MIP circuit.

FIG. 1 shows the conventional dynamic digital MIP circuit. As shown in FIG. 1, the dynamic digital MIP circuit 100 is achieved with three N-type thin film transistors (NTFTs) for one bit operation. The NTFTs comprise the first transistor (M1), the second transistor (M2) and the third transistor (M3). The manipulation starts at pre-charging the data line in the initial stage. During the reading period, the data line voltage can be defined by the gate bias (Vp) of the third transistor M3. Whereas Vp is a higher voltage, the voltage of data line will be a lower voltage. After that, the inverse data is then written back onto Vp via the first transistor M1 in the writing period. Finally, Vp is coupled by the scan signal through the storage capacitance ($C_S$) and held until the next operation period. The refresh operation must be performed row by row so the largest power is consumed in pre-charging of the data line. For multi-bits applications, the static and dynamic digital MIP circuits still require many scan lines and capacitors to reach polarity inversion.

Therefore, the adoption of analog concept for MIP circuit is attempted since it can achieve high image quality with fewer components. However, the output voltage of the analog memory circuit may have inaccuracy with corresponding data signal, which means that the static image may be distorted by the asymmetric inversion voltage.

Therefore, at present it requires an analog memory cell circuit to minimize the refresh frequency of static image, and reduce the asymmetric inversion voltage to achieve symmetric output waveform. Moreover, a compensation technique is implemented to improve the threshold voltage drop on the output from the input data.

SUMMARY OF THE INVENTION

One of the purposes of present invention is to provide an analog memory cell circuit, in order to reduce the power consumption for the refresh of static image in the liquid crystal display.

An preferred of the present invention provides an analog memory cell circuit for the LTPS TFT-LCD. The circuit comprises the first transistor, the second transistor, the third transistor, the fourth transistor, the fifth transistor, the sixth transistor, the seventh transistor, and the first capacitor. The first transistor has a first jack of the first transistor, a second jack of the first transistor and a control jack of the first transistor. The first jack of the first transistor is connected to the first power source. The second transistor has a first jack of the second transistor, a second jack of the second transistor and a control jack of the second transistor. The first jack of the second transistor is connected to the second power source. The third transistor has a first jack of the third transistor, a second jack of the third transistor and a control jack of the third transistor. The second jack of the third transistor is connected to the reference power source. The first jack of the third transistor is connected to the control jack of the first transistor. The control jack of the third transistor is connected to the second scan signal. The fourth transistor has a first jack of the fourth transistor, a second jack of the fourth transistor and a control jack of the fourth transistor. The first jack of the fourth transistor is connected to the control jack of the second transistor. The second jack of the fourth transistor is connected to the reference power source. The control jack of the fourth transistor is connected to the control jack of the third transistor. The control jack of the fourth transistor is connected to the second scan signal. The fifth transistor has a first jack of the fifth transistor, a second jack of the fifth transistor and a control jack of the fifth transistor. The first jack of the fifth transistor is connected to the second jack of the first transistor. The second jack of the fifth transistor is connected to the output jack. The control jack of the fifth transistor receives a third scan signal. The sixth transistor has a first jack of the sixth transistor, a second jack of the sixth transistor and a control jack of the sixth transistor. The first jack of the sixth transistor is connected to the second jack of the sixth transistor. The second jack of the sixth transistor is connected to the output jack. The control jack of the sixth transistor receives a third scan signal.

The seventh transistor has a first jack of the seventh transistor, a second jack of the seventh transistor and a control jack of the seventh transistor. The control jack of the seventh transistor receives a first scan signal. The first jack of the seventh transistor receives an image data. The first capacitor has a first jack of the first capacitor and a second jack of the first capacitor. The first jack of the first capacitor is connected to the control jack of the first transistor, the first jack of the third transistor and the second jack of the seventh transistor. The second jack of the first capacitor is connected to the first jack of the fourth transistor and the control jack of the second transistor. Wherein, the analog memory cell circuit comprises a plurality of operation periods. In the operation period, the first transistor, the second transistor, the third transistor, the fourth transistor, the fifth transistor, the sixth transistor and the seventh transistor are controlled in accordance with the first scan signal, the second scan signal, and the third scan signal. The output signal is output in the opposite to the output jack.

The first transistor, the fourth transistor, the sixth transistor, and the seventh transistor of present invention are N-type thin film transistors (NTFTs).

The second transistor, the third transistor, and the fifth transistor of present invention are P-type thin film transistors (PTFTs).

The analog memory cell circuit of present invention includes a first operation period, a second operation period, and a third operation period. In the first operation period, the second scan signal and the third scan signal are set to turn the third transistor and the sixth transistor off.

In the second operation period of present invention, the first scan signal is set to turn the seventh transistor off.

In the third operation period of present invention, the second scan signal and the third scan signal are set to turn the fourth transistor and the fifth transistor off.

Another embodiment of the present invention provides an analog memory cell circuit for the LTPS TFT-LCD. The circuit comprises nine transistors and a capacitor. The first transistor has a first jack of the first transistor, a second jack of the first transistor and a control jack of the first transistor. The first jack of the first transistor is connected to the first power source. The second transistor has a first jack of the second transistor, a second jack of the second transistor and a control jack of the second transistor. The first jack of the second transistor is connected to the second power source. The third transistor has a first jack of the third transistor, a second jack of the third transistor and a control jack of the third transistor. The second jack of the third transistor is connected to the reference power source. The first jack of the third transistor is connected to the control jack of the first transistor. The control jack of the third transistor is connected to the third scan signal. The fourth transistor has a first jack of the fourth transistor, a second jack of the fourth transistor and a control jack of the fourth transistor. The first jack of the fourth transistor is connected to the control jack of the second transistor. The second jack of the fourth transistor is connected to the reference power source. The control jack of the fourth transistor is connected to the control jack of the third transistor. The control jack of the fourth transistor is connected to the third scan signal. The fifth transistor has a first jack of the fifth transistor, a second jack of the fifth transistor and a control jack of the fifth transistor. The first jack of the fifth transistor is connected to the second jack of the first transistor. The second jack of the fifth transistor is connected to the output jack. The control jack of the fifth transistor receives a third scan signal.

The sixth transistor has a first jack of the sixth transistor, a second jack of the sixth transistor and a control jack of the sixth transistor. The first jack of the sixth transistor is connected to the second jack of the sixth transistor. The second jack of the sixth transistor is connected to the output jack. The control jack of the sixth transistor receives a third scan signal. The seventh transistor has a first jack of the seventh transistor, a second jack of the seventh transistor and a control jack of the seventh transistor. The control jack of the seventh transistor receives a first scan signal. The first jack of the seventh transistor is connected to the first jack of the first transistor. The eighth transistor has a first jack of the eighth transistor, a second jack of the eighth transistor and a control jack of the eighth transistor. The second jack of the eighth transistor is connected to the first jack of the first transistor. The first jack of the eighth transistor is connected to the first power source. The control jack of the eighth transistor is connected to the second scan signal. The ninth transistor has a first jack of the ninth transistor, a second jack of the ninth transistor and a control jack of the ninth transistor. The first jack of the ninth transistor is connected to the image data. The second jack of the ninth transistor is connected to the second jack of the first transistor and the first jack of the fifth transistor. The control jack of the ninth transistor receives the first scan signal. The first capacitor has a first jack of the first capacitor and a second jack of the first capacitor. The first jack of the first capacitor is connected to the control jack of the first transistor, the first jack of the third transistor and the second jack of the seventh transistor. The second jack of the first capacitor is connected to the first jack of the fourth transistor and the control jack of the second transistor.

Wherein, the analog memory cell circuit includes a plurality of operation periods. In the plurality of operation period, the first transistor, the second transistor, the third transistor, the fourth transistor, the fifth transistor, the sixth transistor, the seventh transistor, the eighth transistor and the ninth transistor are controlled in accordance with the first scan signal, the second scan signal, and the third scan signal. The output signal is output in the opposite to the output jack.

The first transistor, the fourth transistor, the sixth transistor, the seventh transistor and the ninth transistor of the present embodiment are N-type thin film transistors (NTFTs).

In order to understand the above-mentioned and other purposes, characteristics and advantages of present invention more obviously, the detailed explanation is described as follows with preferred embodiments and figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 2:
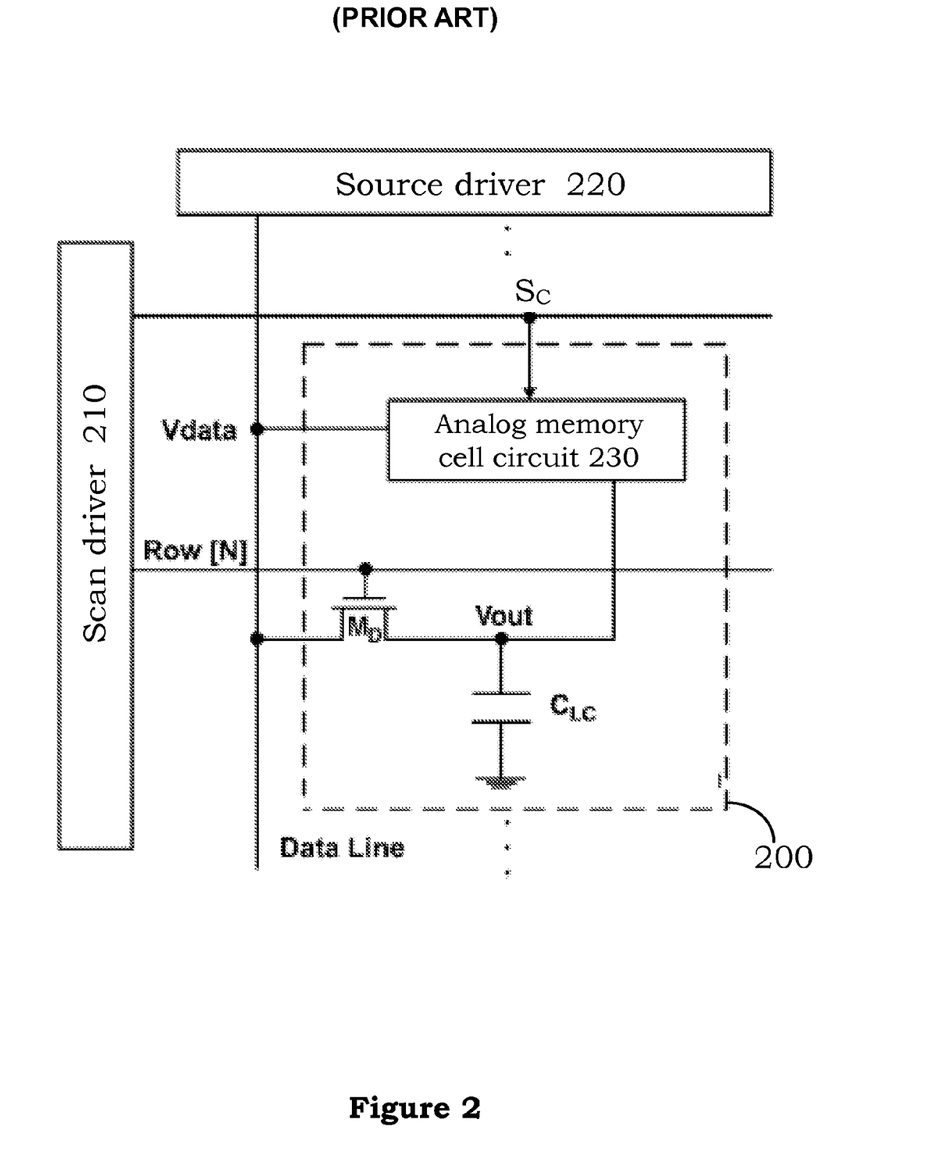
FIG. 2 is a block diagram showing the analog memory cell circuit in a conventional pixel of LCD.

FIG. 2 shows the block diagram of the analog memory cell circuit 230 in a conventional pixel 200 of LCD, wherein the pixel 200 is connected to the scan driver 210 and the source driver 220.

As shown in FIG. 2, the pixel 200 comprises an analog memory cell circuit 230, a transistor ($M_D$), and a liquid crystal capacitor ($C_{LC}$). The LCD image includes the dynamic image and the static image. During the normal mode, the dynamic image can be performed by the conventional pixel operation through transistor. Furthermore, during the standby mode for static image, the scan driver 210 switches input from row signal (Row[N]) to control signals. The analog memory cell circuit 230 samples Vdata from source driver 220 and cooperates with control signals (Sc) to generate self inversion voltage (Vout).

Figure 3A:
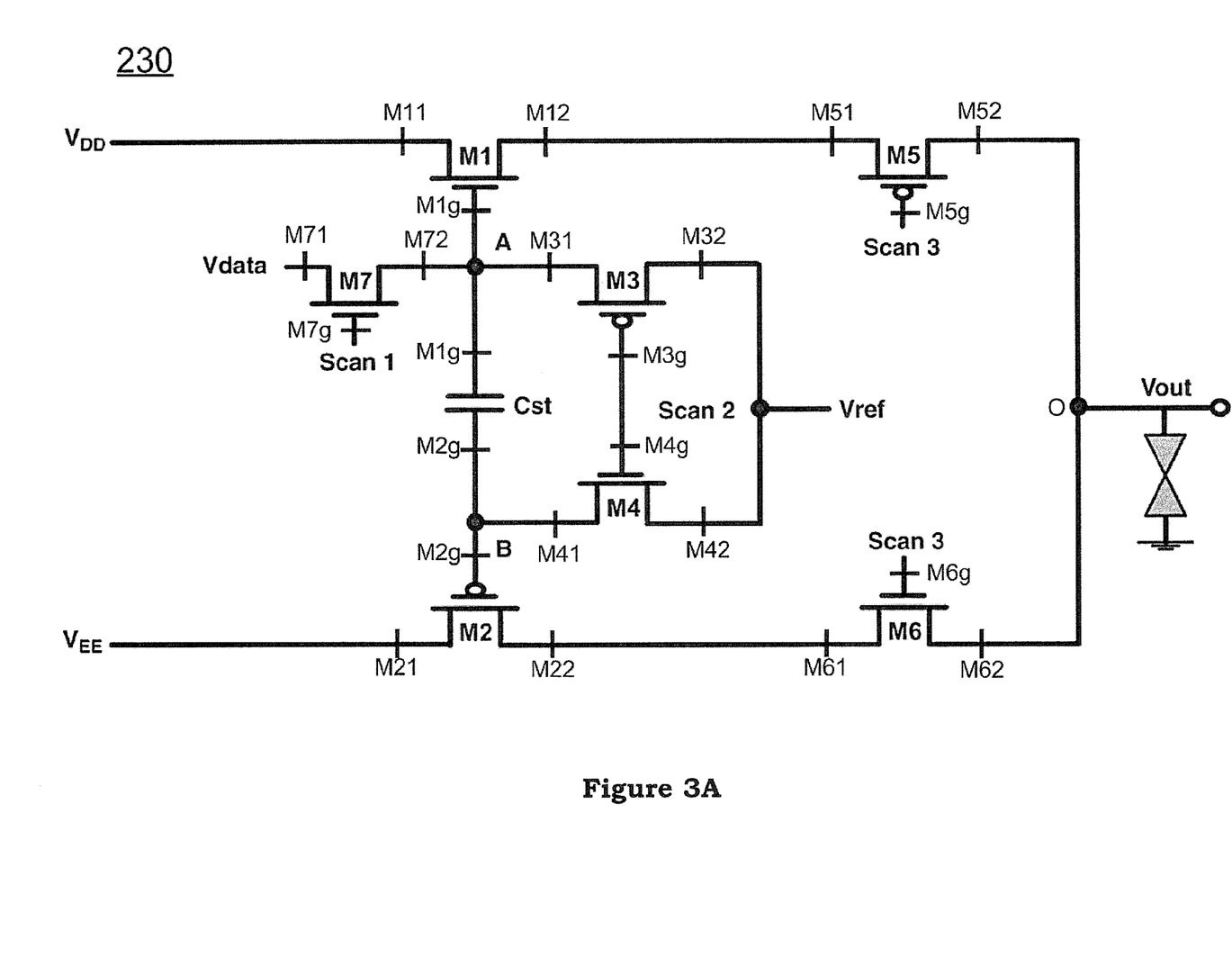
FIG. 3A is a schematic diagram showing the analog memory cell circuit for an embodiment of the invention.
Figure 3B:
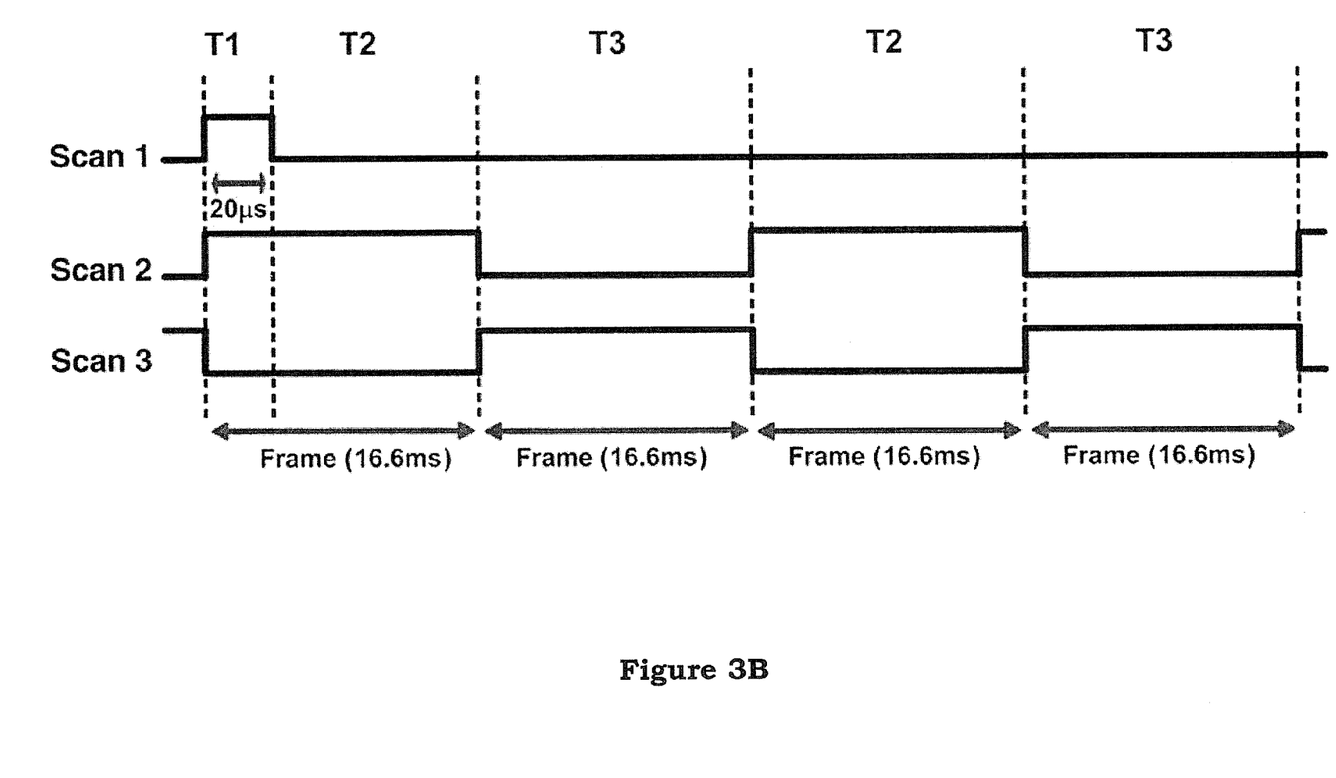
FIG. 3B is a schematic diagram showing the corresponding waveforms of scan lines according to FIG. 3A.

Please refer to FIG. 2, FIG. 3A and FIG. 3B for the first embodiment. Wherein, FIG. 3A depicts the analog memory cell circuit of the embodiment. FIG. 3B depicts its corresponding waveforms of scan lines according to FIG. 3A. The source driver 220 provides the image data (Vdata), where Vdata equals to the original pixel data (Vp1) pluses the threshold voltage (Vt) of Poly-Si TFT. After the analog memory cell circuit 230 samples the Vdata, the source driver 220 can be turned off until the specific time is arrived. With 315.4 ms as an example (19 times of typical TFT-LCD frame time), the source driver 220 can be operated from 60 to 3.16 Hz for refreshing static image to save power.

As shown in FIG. 3A, the analog memory cell circuit 230 is composed of two driving transistors (the first transistor M1 and the second transistor M2), and five switch transistors (the third transistor M3, the fourth transistor M4, the fifth transistor M5, the sixth transistor M6 and the seventh transistor M7). The analog memory cell circuit 230 is suitable for the low temperature polycrystalline silicon thin film transistor liquid crystal display (LTPS TFT-LCD). The first transistor (M1) has a first jack (M11) of the first transistor, a second jack (M12) of the first transistor and a control jack (M1g) of the first transistor. The first jack (M11) of the first transistor is connected to the first power source ($V_{DD}$). The second transistor (M2) has a first jack (M21) of the second transistor, a second jack (M22) of the second transistor and a control jack (M2g) of the second transistor. The first jack (M21) of the second transistor is connected to the second power source ($V_{EE}$). The third transistor has a first jack (M31) of the third transistor, a second jack (M32) of the third transistor and a control jack (M3g) of the third transistor. The second jack (M32) of the third transistor is connected to the reference power source (Vref). The first jack (M31) of the third transistor is connected to the control jack (M3g) of the first transistor. The control jack (M3g) of the third transistor is connected to the second scan signal (Scan 2). The fourth transistor (M4) has a first jack (M41) of the fourth transistor, a second jack (M42) of the fourth transistor and a control jack (M4g) of the fourth transistor. The first jack (M41) of the fourth transistor is connected to the control jack (M2g) of the second transistor. The second jack (M42) of the fourth transistor is connected to the reference power source (Vref). The control jack (M4g) of the fourth transistor is connected to the control jack (M3g) of the third transistor. The control jack (M4g) of the fourth transistor is connected to the second scan signal (Scan 2). The fifth transistor has a first jack (M51) of the fifth transistor, a second jack (M52) of the fifth transistor and a control jack (M5g) of the fifth transistor. The first jack (M51) of the fifth transistor is connected to the second jack (M52) of the first transistor. The second jack (M52) of the fifth transistor is connected to the output jack (O). The control jack (M5g) of the fifth transistor receives the third scan signal (Scan 3). The sixth transistor (M6) has a first jack (M61) of the sixth transistor, a second jack (M62) of the sixth transistor and a control jack (M6g) of the sixth transistor. The first jack (M61) of the sixth transistor is connected to the second jack (M62) of the sixth transistor. The second jack (M62) of the sixth transistor is connected to the output jack (O). The control jack (M6g) of the sixth transistor receives the third scan signal (Scan 3). The seventh transistor (M7) has a first jack (M71) of the seventh transistor, a second jack (M72) of the seventh transistor and a control jack (M7g) of the seventh transistor. The control jack (M7g) of the seventh transistor receives the first scan signal (Scan 1). The first jack (M71) of the seventh transistor receives the image data (Vdata).

In this embodiment, the first transistor, the fourth transistor, the sixth transistor, and the seventh transistor of present invention are N-type thin film transistors (NTFTs). The second transistor, the third transistor, and the fifth transistor of present invention are P-type thin film transistors (PTFTs). Of course, the NTFTs or the PTFTs are alternatively elected for the embodiment.

As shown in FIG. 3A, the analog memory cell circuit 230 further comprises a storage capacitor (Cst), which has a first jack (Cst1) and a second jack (Cst2). The first jack (Cst1) of storage capacitor is connected to the control jack (M1g) of the first transistor, the first jack (M31) of the third transistor, and the second jack (M72) of the seventh transistor. The second jack (Cst2) of the first storage capacitor is connected to the first jack (M41) of the fourth transistor and the control jack (M2g) of the second transistor.

The analog memory cell circuit 230 of this embodiment has three operation periods, including the first operation period (T1), the second operation period (T2), and the third operation period (T3). Wherein the first operation period (T1) is the pre-charging period, the second operation period (T2) is the positive voltage holding period, and the third operation period (T3) is the negative voltage holding period. In the first operation period (T1), the second scan signal (Scan 2) and the third scan signal (Scan 3) are set to turn the third transistor (M3) and the sixth transistor (M6) off. The first transistor (M1) is operated as a source follower. At the end of the first operation period (T1), the output signal (Vout) becomes the image data (Vdata) pluses the threshold voltage (Vtn) of first transistor. In the meanwhile, the node voltages of storage capacitor (Cst) are set with $V_A$=Vdata and VB=Vref.

In the second operation period (T2), the first scan signal (Scan 1) becomes the low voltage to turn the seventh transistor (M7) off, and the other transistors are all kept at the previous states. The voltage of first transistor (M1) equals to Vdata. The output signal (Vout) of output jack (O) becomes the image data (Vdata) minuses the threshold voltage (Vtn) of the first transistor.

In the third operation period (T3), the second scan signal (Scan 2) and the third scan signal (Scan 3) are set to turn the fourth transistor (M4) and the fifth transistor (M5) off. Due to the third transistor (M3) is turned on, the reference voltage (Vref) is applied to the node A. The voltage of node B goes to 2Vref−Vdata because Cst is boosted by the voltage at node A ($V_A$). At the beginning of third operation period (T3), the second transistor (M2) is operated as a source follower. The output voltage (Vout) of output jack (O) goes to 2Vref minuses the image data (Vdata) pluses the absolute threshold voltage (Vtp) of the second transistor (M2).

In the above-mentioned embodiment, the analog memory cell circuit 230 is produced by 3 μm low temperature polycrystalline silicon (LTPS) manufactured process. The aspect ratio of channel width (W) to channel length (L), W/L, for the first transistor (M1) and the second transistor (M2) are 30 μm/5 μm, and those for the third transistor (M3) and the fourth transistor (M4) are 3 μm/5 μm, those for the fifth transistor (M5), the sixth transistor (M6), and the seventh transistor (M7) are 5 μm/5 μm. Furthermore, the storage capacitor (Cst) is 5 pF. The DC voltage supplies are $V_{DD}$=5 V and $V_{EE}$=−5 V.

Figure 4A:
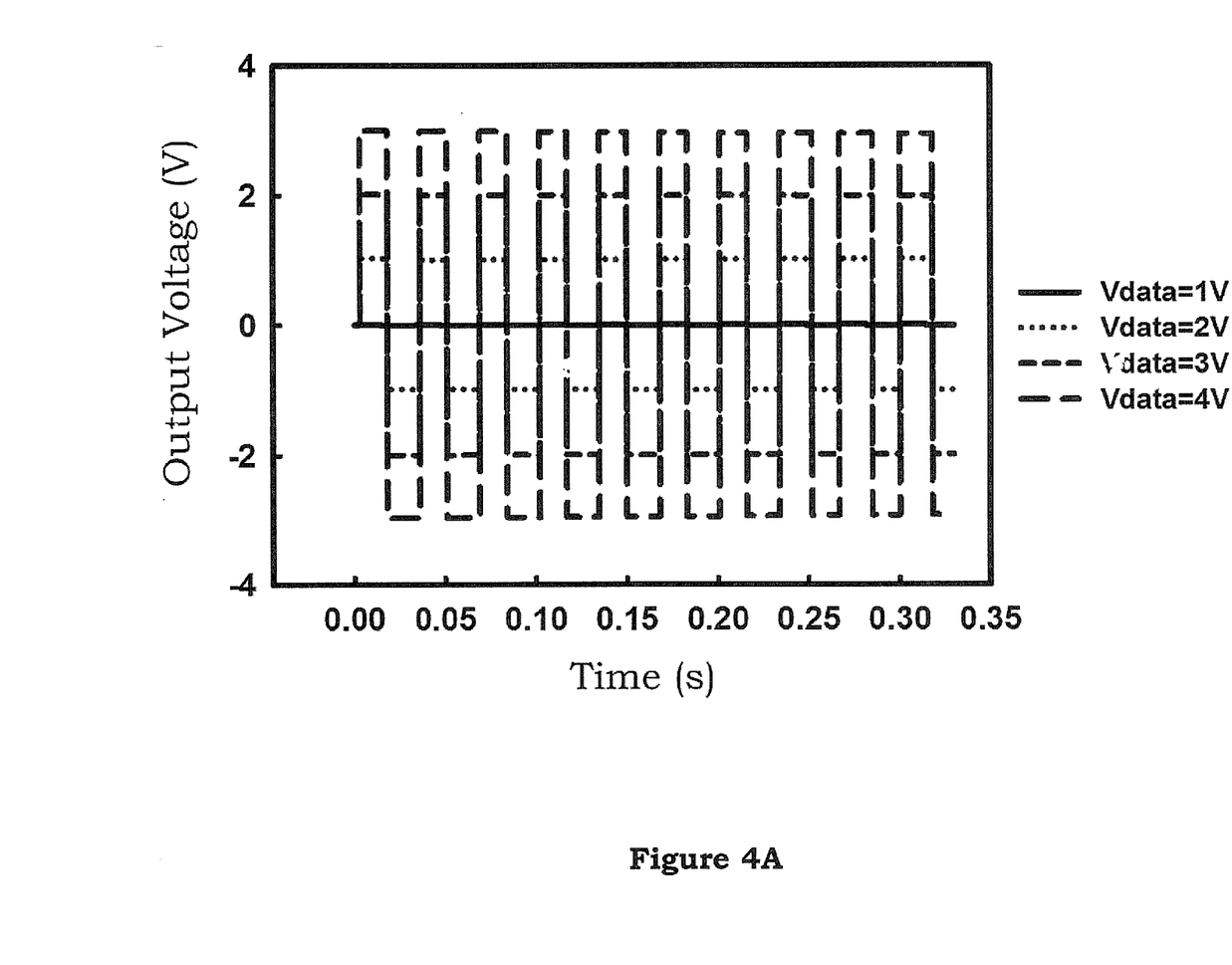
FIG. 4A depicts the simulation results of the output for the analog memory cell circuit 230 shown in FIG. 3A and FIG. 3B.
Figure 4B:
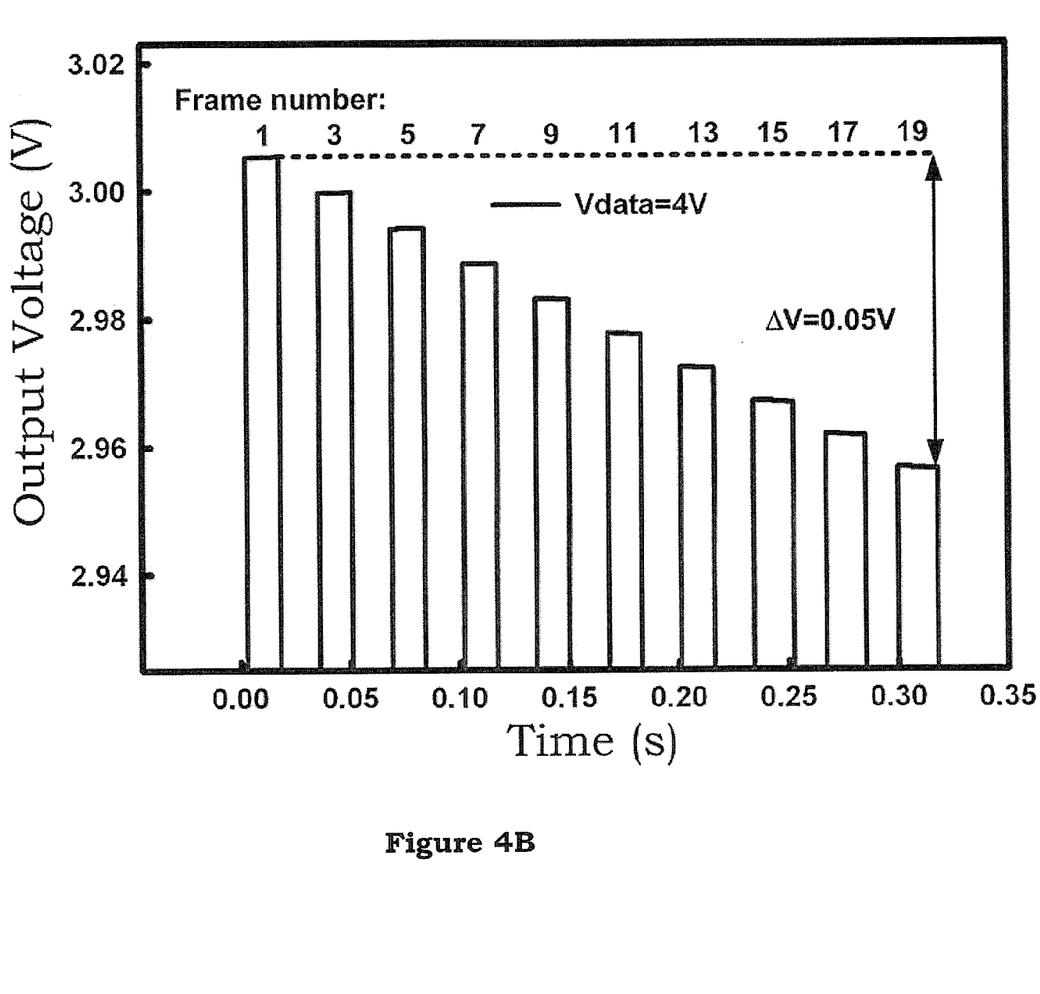
FIG. 4B gives the partial enlarged plot of FIG. 4A when Vdata is 4 V.

Please refer to FIG. 4A and FIG. 4B. FIG. 4A depicts the simulation results of the output for the analog memory cell circuit 230 shown in FIG. 3A and FIG. 3B. FIG. 4B gives the partial enlarged plot of FIG. 4A when Vdata is 4 V. FIG. 4A depicts the waveform of output signal (Vout) under Vdata of 1, 2, 3, and 4 V, respectively. The 20-frame time (20×16.6 ms=332 ms) per Scan 1 pulse is set for the timing duration of Scan 1 signal. The power consumption comes from the source driver 220 only when Vdata is sampled by the analog memory cell circuit 230. In this embodiment, the simulated output signal is the symmetric waveform no matter how the input data changes. In addition, the high and low voltage levels are decreased approximately a threshold voltage due to the operation of source followers.

As shown in FIG. 4B, after nineteen frame time, the simulation result shows that the output voltage decay (ΔV) is only 0.05 V. This means the circuit provided by this embodiment can be effectively operated higher than 5-bit (data range/one gray scale=3/0.05=60) digital memory at the frame rate of 3.16 Hz.

Figure 5A:
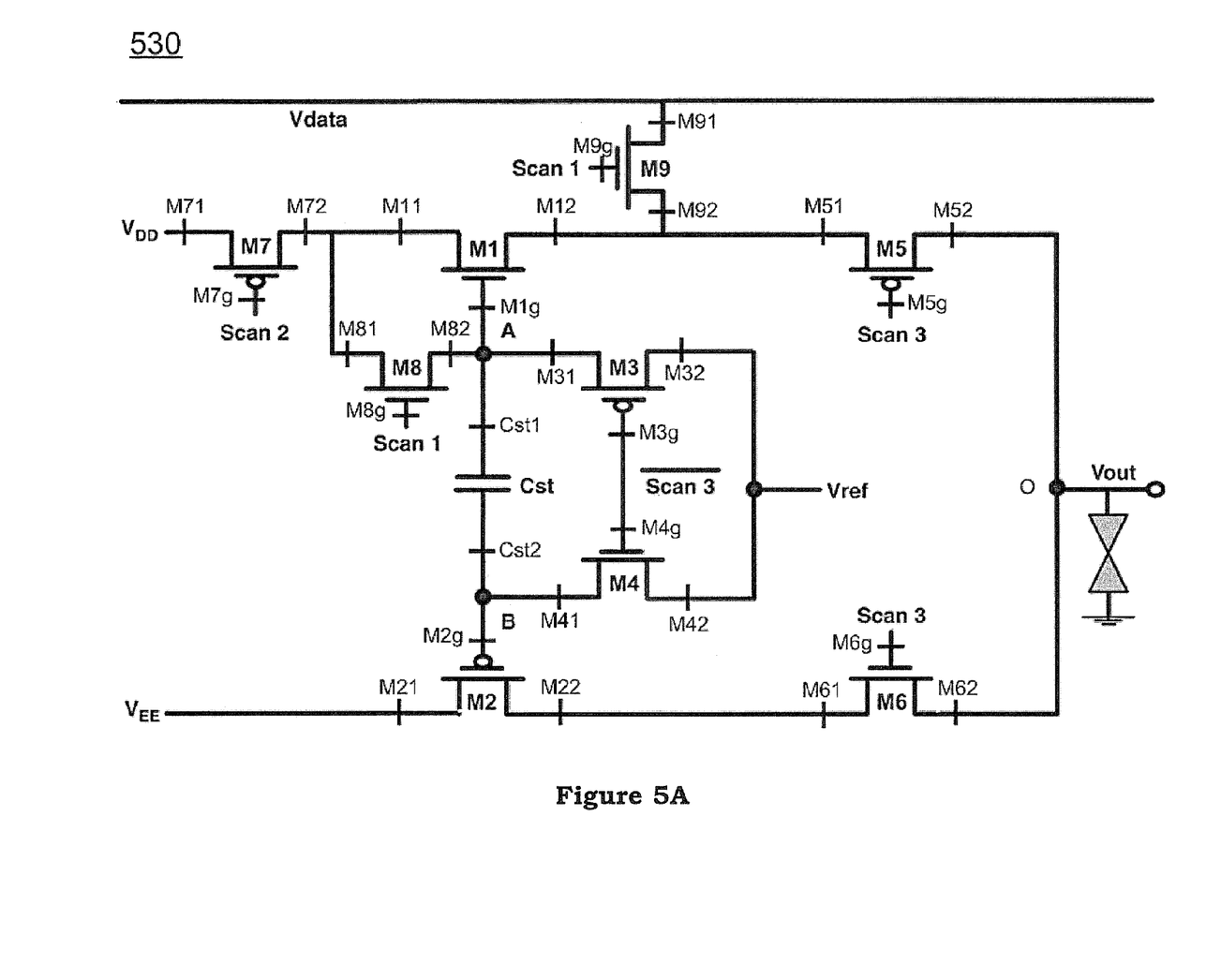
FIG. 5A is a schematic diagram showing the analog memory cell circuit for another embodiment of the invention.
Figure 5B:
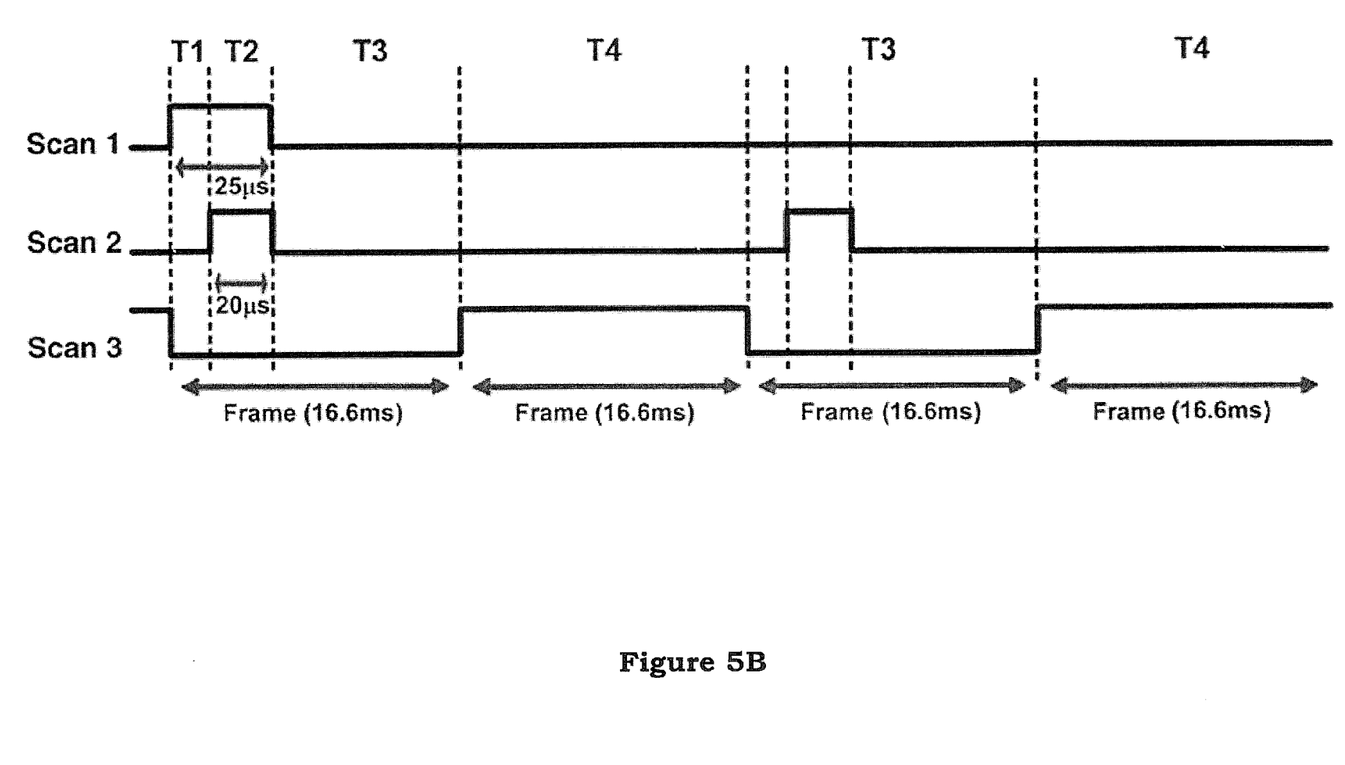
FIG. 5B is a schematic diagram showing the corresponding waveforms of scan lines according to FIG. 5A.

Please refer to FIG. 5A and FIG. 5B. Wherein, FIG. 5A depicts the analog memory cell circuit of another (second) embodiment. FIG. 5B depicts the corresponding waveforms of scan lines according to FIG. 5A. In the second embodiment, the present invention provides to an analog memory cell circuit 530 for the low temperature polycrystalline silicon thin film transistor liquid crystal display. The analog memory cell circuit 530 comprises the following components. The first transistor (M1) has a first jack (M11) of the first transistor, a second jack (M12) of the first transistor and a control jack (M1g) of the first transistor. The first jack (M11) of the first transistor is connected to the first power source ($V_{DD}$). The second transistor (M2) has a first jack (M21) of the second transistor, a second jack (M22) of the second transistor and a control jack (M2g) of the second transistor. The first jack (M21) of the second transistor is connected to the second power source ($V_{EE}$). The third transistor has a first jack (M31) of the third transistor, a second jack (M32) of the third transistor and a control jack (M3g) of the third transistor. The second jack (M32) of the third transistor is connected to the reference power source (Vref). The first jack (M31) of the third transistor is connected to the control jack (M3g) of the first transistor. The control jack (M3g) of the third transistor is connected to the third scan signal (Scan 3). The fourth transistor (M4) has a first jack (M41) of the fourth transistor, a second jack (M42) of the fourth transistor and a control jack (M4g) of the fourth transistor. The first jack (M41) of the fourth transistor is connected to the control jack (M2g) of the second transistor. The second jack (M42) of the fourth transistor is connected to the reference power source (Vref). The control jack (M4g) of the fourth transistor is connected to the control jack (M3g) of the third transistor. The control jack (M4g) of the fourth transistor is connected to the third scan signal (Scan 3). The fifth transistor has a first jack (M51) of the fifth transistor, a second jack (M52) of the fifth transistor and a control jack (M5g) of the fifth transistor. The first jack (M51) of the fifth transistor is connected to the second jack (M52) of the first transistor. The second jack (M52) of the fifth transistor is connected to the output jack (O). The control jack (M5g) of the fifth transistor receives the third scan signal (Scan 3).

The sixth transistor (M6) has a first jack (M61) of the sixth transistor, a second jack (M62) of the sixth transistor and a control jack (M6g) of the sixth transistor. The first jack (M61) of the sixth transistor is connected to the second jack (M62) of the sixth transistor. The second jack (M62) of the sixth transistor is connected to the output jack (O). The control jack (M6g) of the sixth transistor receives the third scan signal (Scan 3). The seventh transistor (M7) has a first jack (M71) of the seventh transistor, a second jack (M72) of the seventh transistor and a control jack (M7g) of the seventh transistor. The control jack (M7g) of the seventh transistor receives the first scan signal (Scan 1). The first jack (M71) of the seventh transistor is connected to the first jack (M11) of the first transistor. The eighth transistor (M8) has a first jack (M81) of the eighth transistor, a second jack (M82) of the eighth transistor and a control jack (M8g) of the eighth transistor. The second jack (M82) of the eighth transistor is connected to the first jack (M11) of the first transistor. The first jack (M81) of the eighth transistor is connected to the first power source ($V_{DD}$). The control jack (M8g) of the eighth transistor is connected to the second scan signal (Scan 2). The ninth transistor (M9) has a first jack (M91) of the ninth transistor, a second jack (M92) of the ninth transistor and a control jack (M9g) of the ninth transistor. The first jack (M91) of the ninth transistor is connected to the image data (Vdata). The second jack (M92) of the ninth transistor is connected to the second jack (M12) of the first transistor and the first jack (M51) of the fifth transistor. The control jack (M9g) of the ninth transistor receives the first scan signal (Scan 1). The first capacitor (Cst) has a first jack (Cst1) of the first capacitor and a second jack (Cst2) of the first capacitor. The first jack (Cst1) of the first capacitor is connected to the control jack (M1g) of the first transistor, the first jack (M31) of the third transistor and the second jack (M72) of the seventh transistor. The second jack (Cst2) of the first capacitor is connected to the first jack (M41) of the fourth transistor and the control jack (M2g) of the second transistor.

In this embodiment, the first transistor (M1), the fourth transistor (M4), the sixth transistor (M6), and the seventh transistor (M7) of present invention are N-type thin film transistors (NTFTs). The second transistor (M2), the third transistor (M3), the fifth transistor (M5), and the eighth transistor (M8) of present invention are P-type thin film transistors (PTFTs).

In the above-mentioned embodiment, the analog memory cell circuit 530 is produced by 3 μm low temperature polycrystalline silicon (LTPS) manufactured process. The aspect ratio of channel width (W) to channel length (L), W/L, for the first transistor (M1) and the second transistor (M2) are 30 μm/5 μm, and those for the third transistor (M3) and the fourth transistor (M4) are 3 μm/5 μm, those for the fifth transistor (M5), the sixth transistor (M6), the seventh transistor (M7), the eighth transistor (M8), and the ninth transistor (M9) are 5 μm/5 μm. Furthermore, the storage capacitor (Cst) is 5 pF. The DC voltage supplies are VDD=5 V and VEE=−5 V.

The analog memory cell circuit 530 of this embodiment has four operation periods, including the first operation period (T1), the second operation period (T2), the third operation period (T3), and the fourth operation period (T4). The first operation period (T1) is the pre-charging period, the second operation period (T2) is the compensation period, the third operation period (T3) is the positive voltage holding period, and the fourth operation period (T4) is the negative voltage holding period. In the first operation period (T1), the first scan signal (Scan 1), the second scan signal (Scan 2) and the third scan signal (Scan 3) are set to turn on the fourth transistor (M4), the fifth transistor (M5), the seventh transistor (M7), the eighth transistor (M8) and the ninth transistor (M9), and turn off the third transistor (M3) and the sixth transistor (M6) off.

In the second operation period (T2), the second scan signal (Scan 2) is set to turn the seventh transistor (M7) off. The first transistor (M1) starts to release charge from node A through the eighth transistor (M8) so that $V_A$ becomes the image data (Vdata) pluses the threshold voltage (Vtn) of the first transistor. In the meanwhile, the storage capacitor (Cst) is set to $V_A$=Vdata+Vtn and $V_B$=Vref.

In the third operation period (T3), the first scan signal (Scan 1) is set to turn the eighth transistor (M8) and the ninth transistor (M9) off. The second scan signal (Scan 2) is set to turn the eight transistor (M8) and the ninth transistor (M9) off. The second scan signal (Scan 2) is set to turn the seven transistor (M7) off, and the other transistors are all kept at the previous states. The gate voltage (M1) of the first transistor is the image data (Vdata) pluses the threshold voltage (Vtn) of the first transistor. The gate voltage (M2) of the second transistor equals to the reference voltage (Vref).

In the fourth operation period (T4), the third scan signal (Scan 3) is set high to turn off the fourth transistor (M4) and the fifth transistor (M5), and turn on the third transistor (M3). Due to the third transistor (M3) is turned on, the reference voltage (Vref) is added to the node A. The voltage of node B goes to 2Vref−(Vdata+Vtn) because Cst is boosted by the voltage at node A ($V_A$). At the beginning of fourth operation period (T4), the second transistor (M2) is operated as a source follower. The output voltage (Vout) of output jack (O) goes to (2Vref−(Vdata+Vtn)+|Vtp|), wherein |Vtp| is the absolute threshold voltage of the second transistor (M2).

The threshold voltage difference between Vtn and Vtp will cause asymmetric waveforms, so that liquid crystal cannot present equal transmittance. In order to solve this issue, the request for negative voltage holding period (T4) is to generate opposite sign voltage (−Vout) during the positive voltage holding period (T3), wherein, Vout will become −Vdata, which gives:

$$-V\text{data}=VB+|Vtp|=2V\text{ref}-(V\text{data}+Vtn)+|Vtp|$$

From the above equation, it is known that the optimized reference voltage can be set to achieve the cancellation of threshold voltage difference between Vtn and Vtp of the first transistor (M1) and the second transistor (M2), so that the asymmetric inversion voltage of analog memory cell circuit can be corrected.

Figure 6A:
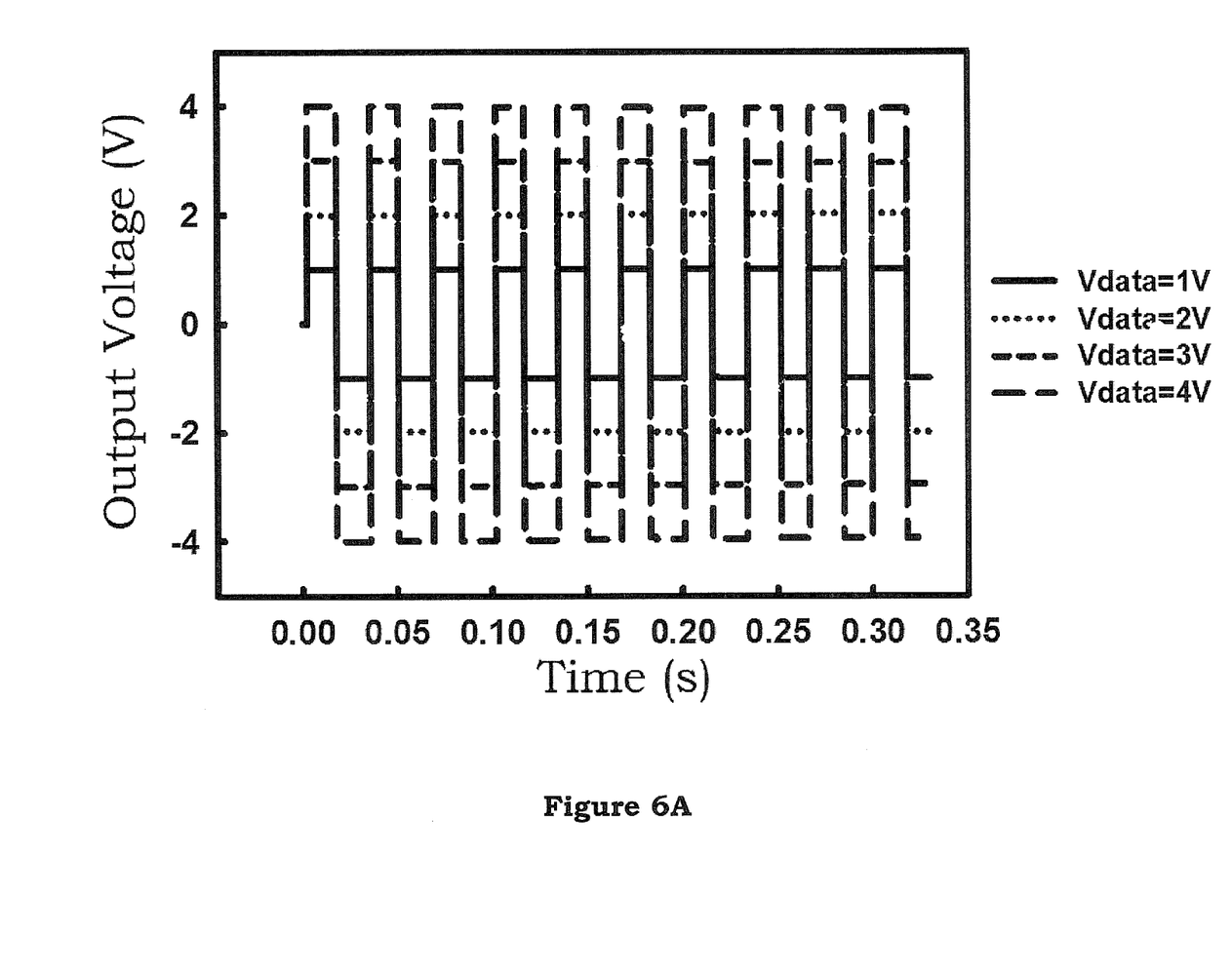
FIG. 6A depicts the simulation results of the output for the analog memory cell circuit 230 shown in FIG. 5A and FIG. 5B.
Figure 6B:
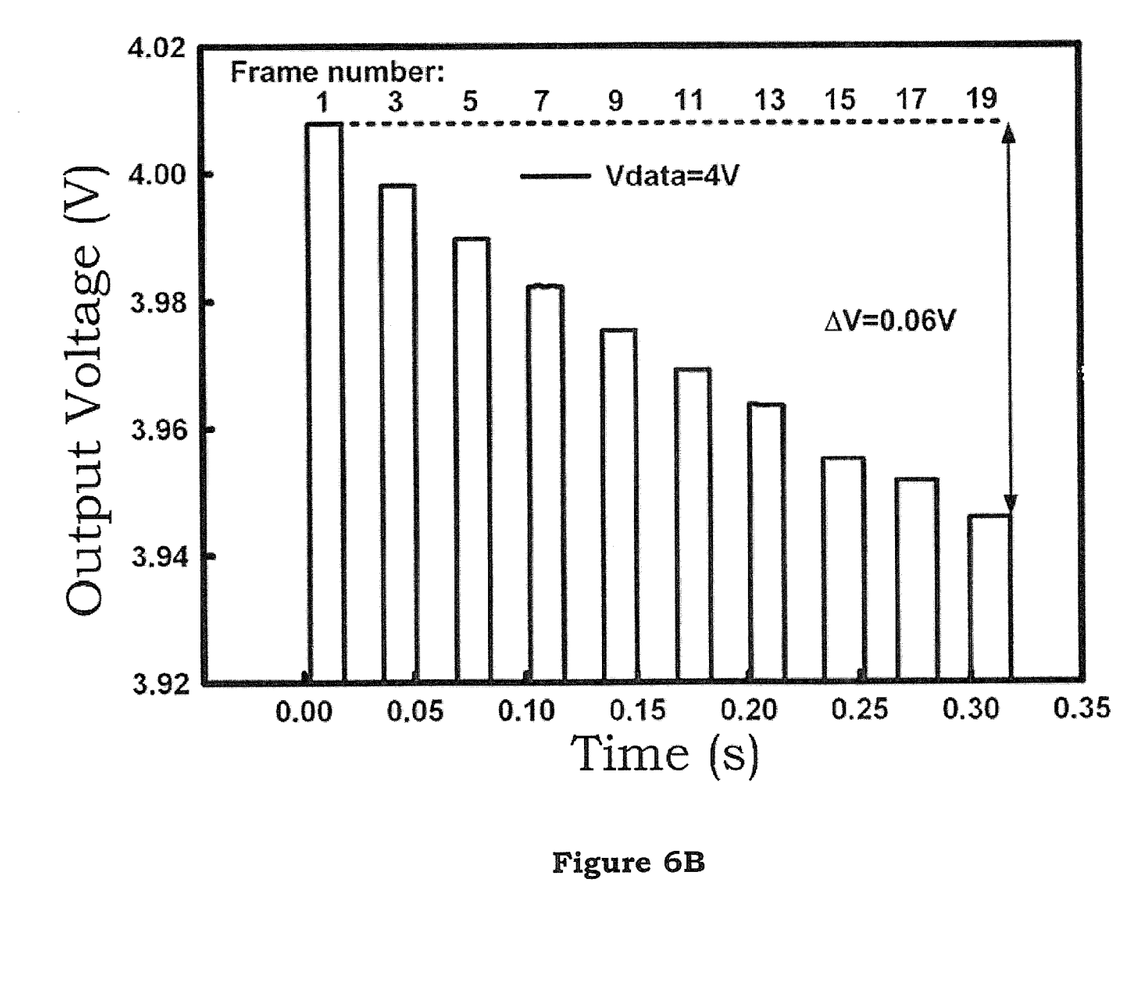
FIG. 6B gives the partial enlarged plot of FIG. 5A when Vdata is 4 V.

Please refer to FIG. 6A and FIG. 6B. FIG. 6A depicts the simulation results of the output for the analog memory cell circuit 530 shown in FIG. 5A and FIG. 5B. FIG. 6B gives the partial enlarged plot of FIG. 5A when Vdata is 4 V. FIG. 6A depicts the waveform of output signal (Vout) under Vdata of 1, 2, 3, and 4 V, respectively. The power consumption comes from the source driver 20 only when Vdata is sampled by the analog memory cell circuit 530.

As shown in FIG. 6B, after nineteen frame time, the simulation result shows that the output voltage decay (ΔV) is only 0.06 V. This means the circuit provided by this embodiment can be effectively operated higher than 6-bit (data range/one gray scale=4/0.06=66.67) digital memory at the frame rate of 3.16 Hz.

From the above-mentioned embodiments, it is known that the power can be saved for thin film transistor liquid crystal display at static state, and the voltage decay at the output only less than 0.1 V. In addition, the compensation technique is provided to improve the output voltage decay due to the threshold voltage drop.

It is understood that various other modifications will be apparent to and can be readily made by those skilled in the art without departing from the scope and spirit of the invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the invention pertains.

What is claimed is:

1. An analog memory cell circuit for a low temperature polycrystalline silicon thin film transistor liquid crystal display (LTPS TFT-LCD), the circuit comprises:
   a first transistor, the first transistor having a first jack of the first transistor, a second jack of the first transistor and a control jack of the first transistor;
   a second transistor, the second transistor having a first jack of the second transistor, a second jack of the second transistor and a control jack of the second transistor, the first jack of the second transistor being connected to a second power source;
   a third transistor, the third transistor having a first jack of the third transistor, a second jack of the third transistor and a control jack of the third transistor, the second jack of the third transistor being connected to a reference power source, the first jack of the third transistor being connected to the control jack of the first transistor, the control jack of the third transistor is connected to a third scan signal;
   a fourth transistor, the fourth transistor having a first jack of the fourth transistor, a second jack of the fourth transistor and a control jack of the fourth transistor, the first jack of the fourth transistor being connected to the control jack of the second transistor, the second jack of the fourth transistor being connected to the reference power source, the control jack of the fourth transistor being connected to the control jack of the third transistor, the control jack of the fourth transistor being connected to the third scan signal;
   a fifth transistor, the fifth transistor having a first jack of the fifth transistor, a second jack of the fifth transistor and a control jack of the fifth transistor, the first jack of the fifth transistor being connected to the second jack of the first transistor, the second jack of the fifth transistor being connected to a output jack, the control jack of the fifth transistor receiving the third scan signal;
   a sixth transistor, the sixth transistor having a first jack of the sixth transistor, a second jack of the sixth transistor and a control jack of the sixth transistor, the first jack of the sixth transistor being connected to the second jack of the sixth transistor, the second jack of the sixth transistor being connected to the output jack, the control jack of the sixth transistor receiving the third scan signal;
   a seventh transistor, the seventh transistor having a first jack of the seventh transistor, a second jack of the seventh transistor and a control jack of the seventh transistor, the control jack of the seventh transistor receiving a first scan signal, the first jack of the seventh transistor being connected to the first jack of the first transistor; and
   a eighth transistor, the eighth transistor having a first jack of the eighth transistor, a second jack of the eighth transistor and a control jack of the eighth transistor, the second jack of the eighth transistor being connected to the first jack of the first transistor, the first jack of the eighth transistor being connected to a first power source, the control jack of the eighth transistor being connected to a second scan signal;
   a ninth transistor, the ninth transistor having a first jack of the ninth transistor, a second jack of the ninth transistor and a control jack of the ninth transistor, the first jack of the ninth transistor is connected to an image data, the second jack of the ninth transistor is connected to the second jack of the first transistor and the first jack of the fifth transistor, the control jack of the ninth transistor receiving the first scan signal;

a first capacitor, the first capacitor having a first jack of the first capacitor and a second jack of the first capacitor, the first jack of the first capacitor being connected to the control jack of the first transistor, the first jack of the third transistor and the second jack of the seventh transistor, the second jack of the first capacitor being connected to the first jack of the fourth transistor and the control jack of the second transistor;

wherein, the first transistor, the fourth transistor, the sixth transistor, the seventh transistor and the ninth transistor comprise a N-type thin film transistor (NTFT), the second transistor, the third transistor, the fifth transistor, and the eighth transistor comprised a P-type thin film transistor (PTFT), the analog memory cell circuit having a plurality of operation periods, in the plurality of operation period, the first transistor, the second transistor, the third transistor, the fourth transistor, the fifth transistor, the sixth transistor, the seventh transistor, the eighth transistor and the ninth transistor being controlled in accordance with the first scan signal, the second scan signal, and the third scan signal, the output signal being output in an opposite to the output jack, wherein the analog memory cell circuit comprises a first operation period, a second operation period, a third operation period and a fourth operation period, in the first operation period, the first scan signal, the second scan signal and the third scan signal are set to turn the fourth transistor, the fifth transistor, the seventh transistor, the eighth transistor and the ninth transistor on, and turn the third transistor and the sixth transistor off, in the second operation period, the second scan signal is set to turn the seventh transistor off, in the third operation period, the first scan signal is set to turn the eighth transistor and the ninth transistor off, the second scan signal is set to turn the seventh transistor off, in the fourth operation period, the third scan signal is set to turn the fourth transistor, the fifth transistor off, and turn the third transistor on.

* * * * *

UNITED STATES PATENT AND TRADEMARK OFFICE
CERTIFICATE OF CORRECTION

| | | |
|---|---|---|
| PATENT NO. | : 9,111,811 B2 | Page 1 of 1 |
| APPLICATION NO. | : 13/962537 | |
| DATED | : August 18, 2015 | |
| INVENTOR(S) | : Po-Tsun Liu et al. | |

It is certified that error appears in the above-identified patent and that said Letters Patent is hereby corrected as shown below:

Title Page,

"Related U.S. Application Data

(62) Division of application No. 11/267,065, filed on Nov. 4, 2005, now Pat. No. 7,374,329."

should read:

--Related U.S. Application Data (62) Division of application No. 13/267,065, filed on Oct. 6, 2011, now abandoned.--

Signed and Sealed this
Twenty-second Day of December, 2015

Michelle K. Lee
*Director of the United States Patent and Trademark Office*